United States Patent
Ritter

(10) Patent No.: US 9,813,041 B1
(45) Date of Patent: Nov. 7, 2017

(54) AUTOMATIC BOOST CONTROL FOR RESONANT COUPLED COILS

(71) Applicant: Apple Inc., Cupertino, CA (US)

(72) Inventor: David W. Ritter, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/449,075

(22) Filed: Jul. 31, 2014

(51) Int. Cl.
| H02J 7/00 | (2006.01) |
| H03H 7/38 | (2006.01) |
| H02J 7/02 | (2016.01) |
| H02J 5/00 | (2016.01) |

(52) U.S. Cl.
CPC .............. *H03H 7/38* (2013.01); *H02J 5/005* (2013.01); *H02J 7/025* (2013.01); *H02J 7/0042* (2013.01)

(58) Field of Classification Search
CPC . H01F 38/14; H02J 17/00; H02J 5/005; H02J 7/025; H03H 7/38
See application file for complete search history.

(56) References Cited

U.S. PATENT DOCUMENTS

| | | | |
|---|---|---|---|
| 4,268,899 A | 5/1981 | Rokas | |
| 5,293,308 A | 3/1994 | Boys et al. | |
| 5,639,989 A | 6/1997 | Higgins, III | |
| 6,960,968 B2 | 11/2005 | Odendaal et al. | |
| 6,972,543 B1 | 12/2005 | Wells | |
| 7,641,358 B1 | 1/2010 | Smith et al. | |
| 7,948,208 B2 | 5/2011 | Partovi et al. | |
| 7,952,322 B2 | 5/2011 | Partovi et al. | |
| 8,024,491 B1 | 9/2011 | Wright et al. | |
| 8,054,651 B2 | 11/2011 | Pollard | |
| 8,169,151 B2 | 5/2012 | Kimura | |
| 8,169,185 B2 | 5/2012 | Partovi et al. | |
| 8,274,178 B2 | 9/2012 | Tucker | |
| 8,278,784 B2 | 10/2012 | Cook | |
| 8,362,744 B2 | 1/2013 | Terao et al. | |
| 8,421,274 B2 | 4/2013 | Sun et al. | |
| 8,446,046 B2 | 5/2013 | Fells et al. | |
| 8,629,652 B2 | 1/2014 | Partovi et al. | |

(Continued)

FOREIGN PATENT DOCUMENTS

| CN | 1826715 | 8/2006 |
|---|---|---|
| CN | 101243374 | 8/2006 |

(Continued)

OTHER PUBLICATIONS

U.S. Appl. No. 14/290,411, filed May 29, 2014, Bossetti.

(Continued)

*Primary Examiner* — Vuthe Siek
(74) *Attorney, Agent, or Firm* — Brownstein Hyatt Farber Schreck, LLP

(57) ABSTRACT

Wireless power transfer systems having improved power transfer efficiency are disclosed. A wireless power receiver may include an automatic impedance regulator that adjusts the effective input impedance of the receiver depending upon the power requirements of the receiver. For example, in certain embodiments, the impedance regulator is a boost converter. The boost converter may exploit the leakage inductance of the receive coil to boost the voltage output from the terminals of the receive coil. The effective input impedance may be substantially matched to the output impedance of the transmitter.

18 Claims, 5 Drawing Sheets

(56) References Cited

U.S. PATENT DOCUMENTS

| | | | |
|---|---|---|---|
| 8,629,654 B2 | 1/2014 | Partovi et al. | |
| 8,663,106 B2 | 3/2014 | Stivoric | |
| 8,810,071 B2 | 8/2014 | Sauerlaender et al. | |
| 8,884,469 B2 | 11/2014 | Lemmens | |
| 8,947,047 B2 | 2/2015 | Partovi et al. | |
| 9,018,904 B2 | 4/2015 | Seyerle et al. | |
| 9,030,421 B2 | 5/2015 | Tseng et al. | |
| 9,093,857 B2 | 7/2015 | Sakai et al. | |
| 9,099,885 B2 | 8/2015 | Kamata | |
| 9,106,083 B2 | 8/2015 | Partovi | |
| 9,112,362 B2 | 8/2015 | Partovi | |
| 9,112,363 B2 | 8/2015 | Partovi | |
| 9,112,364 B2 | 8/2015 | Partovi | |
| 9,124,112 B2 | 9/2015 | Havass et al. | |
| 9,126,490 B2 | 9/2015 | Cook et al. | |
| 9,154,189 B2 | 10/2015 | Von Novak et al. | |
| 9,160,180 B2 | 10/2015 | Suzuki et al. | |
| 9,178,369 B2 | 11/2015 | Partovi | |
| 9,197,070 B2 | 11/2015 | Jung | |
| 9,231,411 B2 | 1/2016 | Baarman et al. | |
| 9,270,138 B2 | 2/2016 | Yamakawa et al. | |
| 9,276,437 B2 | 3/2016 | Partovi et al. | |
| 9,318,915 B2 | 4/2016 | Miller et al. | |
| 9,352,661 B2 | 5/2016 | Keeling et al. | |
| 9,356,659 B2 | 5/2016 | Partovi | |
| 9,407,107 B2 | 8/2016 | Park et al. | |
| 9,460,846 B2 | 10/2016 | Graham et al. | |
| 9,496,731 B2 | 11/2016 | Park et al. | |
| 9,509,374 B2 | 11/2016 | Kim et al. | |
| 9,515,514 B2 | 12/2016 | Lee et al. | |
| 9,537,363 B2 | 1/2017 | Thompson et al. | |
| 9,685,814 B1 | 6/2017 | Moyer et al. | |
| 9,768,643 B2 | 9/2017 | Kanno et al. | |
| 2001/0044588 A1 | 11/2001 | Mault | |
| 2008/0284609 A1 | 11/2008 | Rofougaran | |
| 2010/0328044 A1 | 12/2010 | Waffenschmidt et al. | |
| 2011/0050164 A1 | 3/2011 | Partovi et al. | |
| 2011/0109264 A1 | 5/2011 | Choi | |
| 2011/0136550 A1 | 6/2011 | Maugars | |
| 2011/0198937 A1 | 8/2011 | Tseng | |
| 2011/0221385 A1 | 9/2011 | Partovi | |
| 2011/0234012 A1 | 9/2011 | Yi et al. | |
| 2011/0241615 A1 | 10/2011 | Yeh | |
| 2011/0254379 A1 | 10/2011 | Madawala | |
| 2011/0302078 A1 | 12/2011 | Failing | |
| 2012/0068550 A1 | 3/2012 | Boer et al. | |
| 2012/0146576 A1 | 6/2012 | Partovi | |
| 2012/0235506 A1* | 9/2012 | Kallal | H02J 5/005 307/104 |
| 2012/0255039 A1 | 10/2012 | Sipes | |
| 2012/0313577 A1 | 12/2012 | Moes et al. | |
| 2013/0076648 A1 | 3/2013 | Krah et al. | |
| 2013/0093388 A1 | 4/2013 | Partovi | |
| 2013/0093389 A1 | 4/2013 | Partovi | |
| 2013/0099563 A1 | 4/2013 | Partovi et al. | |
| 2013/0099735 A1 | 4/2013 | Partovi | |
| 2013/0140903 A1* | 6/2013 | Divan | H02J 3/01 307/82 |
| 2013/0234532 A1 | 9/2013 | Fells et al. | |
| 2013/0257168 A1 | 10/2013 | Singh | |
| 2013/0260677 A1 | 10/2013 | Partovi | |
| 2013/0271069 A1 | 10/2013 | Partovi | |
| 2013/0285604 A1 | 10/2013 | Partovi | |
| 2013/0285605 A1 | 10/2013 | Partovi | |
| 2013/0300204 A1 | 11/2013 | Partovi | |
| 2013/0334326 A1 | 12/2013 | Shan | |
| 2014/0015327 A1 | 1/2014 | Keeling et al. | |
| 2014/0015522 A1 | 1/2014 | Widmer et al. | |
| 2014/0035378 A1 | 2/2014 | Kesler et al. | |
| 2014/0103873 A1 | 4/2014 | Partovi et al. | |
| 2014/0129010 A1 | 5/2014 | Garg | |
| 2014/0132210 A1 | 5/2014 | Partovi | |
| 2014/0159656 A1 | 6/2014 | Riehl | |
| 2014/0191568 A1 | 7/2014 | Partovi | |
| 2014/0191818 A1 | 7/2014 | Waffenschmidt et al. | |
| 2014/0197687 A1 | 7/2014 | Lin | |
| 2014/0197782 A1 | 7/2014 | Graf et al. | |
| 2014/0225439 A1 | 8/2014 | Mao | |
| 2014/0266018 A1 | 9/2014 | Carobolante | |
| 2014/0306654 A1 | 10/2014 | Partovi | |
| 2014/0347007 A1 | 11/2014 | Kee et al. | |
| 2015/0001950 A1 | 1/2015 | Chung et al. | |
| 2015/0035372 A1 | 2/2015 | Aioanei | |
| 2015/0077045 A1 | 3/2015 | Harris | |
| 2015/0280455 A1 | 3/2015 | Bosshard et al. | |
| 2015/0130412 A1 | 5/2015 | Partovi | |
| 2015/0207333 A1 | 7/2015 | Baarman et al. | |
| 2015/0215006 A1* | 7/2015 | Mehas | H02J 7/025 307/104 |
| 2015/0244179 A1 | 8/2015 | Ritter et al. | |
| 2015/0244341 A1 | 8/2015 | Ritter et al. | |
| 2015/0270058 A1 | 9/2015 | Golko et al. | |
| 2015/0333530 A1 | 11/2015 | Moyer et al. | |
| 2015/0349538 A1* | 12/2015 | Agostinelli | H02M 7/217 307/104 |
| 2015/0364931 A1* | 12/2015 | Ren | H02J 5/005 307/104 |
| 2016/0043567 A1 | 2/2016 | Matsumoto et al. | |
| 2016/0056664 A1 | 2/2016 | Partovi | |
| 2016/0064948 A1 | 3/2016 | Heresztyn et al. | |
| 2016/0064992 A1 | 3/2016 | Herbst et al. | |
| 2016/0127672 A1 | 5/2016 | Kamide et al. | |
| 2016/0172894 A1 | 6/2016 | Khripkov et al. | |
| 2016/0181849 A1 | 6/2016 | Govindaraj | |
| 2016/0261137 A1 | 9/2016 | Riehl | |
| 2016/0285278 A1 | 9/2016 | Mehas et al. | |
| 2017/0012463 A1 | 1/2017 | Lynch | |
| 2017/0089959 A1 | 3/2017 | Ito et al. | |
| 2017/0110911 A1 | 4/2017 | Bossetti et al. | |

FOREIGN PATENT DOCUMENTS

| | | |
|---|---|---|
| CN | 101232190 | 7/2008 |
| CN | 101814757 | 8/2010 |
| CN | 102124624 | 7/2011 |
| CN | 102257696 | 11/2011 |
| CN | 102355035 | 2/2012 |
| CN | 202712982 | 1/2013 |
| CN | 103019485 | 4/2013 |
| CN | 202976038 | 6/2013 |
| CN | 103269092 | 8/2013 |
| CN | 103326475 | 9/2013 |
| CN | 103457362 | 12/2013 |
| CN | 103518175 | 1/2014 |
| CN | 103545893 | 1/2014 |
| CN | 103765722 | 4/2014 |
| CN | 103812162 | 5/2014 |
| CN | 103999320 | 8/2014 |
| EP | 1633122 | 8/2005 |
| EP | 2642628 | 9/2013 |
| GB | 2484999 | 5/2012 |
| JP | H08331850 | 12/1996 |
| JP | 2010161882 | 7/2010 |
| JP | 2010268531 | 11/2010 |
| JP | 2013115929 | 6/2013 |
| JP | 2013183497 | 9/2013 |
| JP | 2013536664 | 9/2013 |
| JP | 2014193087 | 10/2014 |
| KR | 20130055199 | 5/2013 |
| KR | 20140061337 | 5/2014 |
| WO | WO 2010/077991 | 7/2010 |
| WO | WO 2010/108191 | 9/2010 |
| WO | WO 2011/156555 | 12/2011 |
| WO | WO 2012/085119 | 6/2012 |
| WO | WO 16/024869 | 2/2016 |

OTHER PUBLICATIONS

U.S. Appl. No. 14/295,249, filed Jun. 3, 2014, Bossetti et al.
U.S. Appl. No. 14/304,064, filed Jun. 13, 2014, Moyer et al.
U.S. Appl. No. 14/837,965, filed Aug. 27, 2015, Heresztyn et al.
U.S. Appl. No. 14/628,897, filed Feb. 23, 2015, Ritter et al.
U.S. Appl. No. 14/627,957, filed Feb. 20, 2015, Ritter et al.

(56) References Cited

OTHER PUBLICATIONS

U.S. Appl. No. 14/795,723, filed Jul. 9, 2015, Herbst et al.
U.S. Appl. No. 15/179,922, filed Jun. 10, 2016, Lynch.

* cited by examiner

AUTOMATIC BOOST CONTROL FOR RESONANT COUPLED COILS

TECHNICAL FIELD

Embodiments described herein relate to electromagnetic power transfer systems, and, in particular, to systems and methods to for automatically adjusting the effective impedance of an inductive power receiver.

BACKGROUND

Portable electronic devices may include one or more batteries that may require recharging from time to time. Such devices may include electric vehicles, cell phones, smart phones, tablet computers, laptop computers, wearable devices, navigation devices, sports devices, health analysis devices, medical data devices, location tracking devices, accessory devices, home appliances, peripheral input devices, remote control devices, and so on.

Some batteries may recharge wirelessly. For instance, a wireless power transfer system can include an electronic device configured to accept inductive power and a transmitter adapted to produce inductive power. In these systems, a transmit coil within the transmitter may produce an electromagnetic flux that induces a current within a receive coil of the electronic device. The induced current may be used to replenish the charge of a rechargeable battery within the electronic device.

In many cases, change in input impedance may decrease an efficiency of power transfer between the transmitter and receiver.

Accordingly, there may be a present need for an inductive power transfer system with improved tolerance for changes in input impedance of the inductive power receiver.

SUMMARY

Embodiments described herein may relate to, include, or take the form of a coupled coil system for wireless power transfer between a transmitter and receiver, typically including a receive coil in the receiver, a transmit coil in the transmitter having an output impedance, and an input impedance regulator electrically connected to the receive coil and adapted to provide an input impedance for the receiver that may be substantially equal to the output impedance of the transmit coil.

Other embodiments may include a configuration in which the input impedance regulator includes a direct current to direct current converter such as a boost converter, a buck converter, or a boost-buck converter. These examples may include a boost converter may be adapted to boost the output voltage of the receive coil by charging and discharging a leakage inductance of the receive coil. In many cases, the boost converter may operate in at least a charging stage and a power stage. For example, while in the charging stage the embodiment may direct current along or through a first current path including at least one resistive element. While operating in the power stage the embodiment may transmit current along a second current path including a programmable resistive load.

Certain embodiments may include an impedance controller configured to switch from the charging stage to the power stage in response to a determination that current through the at least one resistive element exceeds a selected threshold. Thereafter, the impedance controller may be configured to switch back from the power stage to the charging stage after a selected time period.

Some embodiments described herein may relate to, include, or take the form of a method for regulating input impedance of an inductive power receiver including at least the operations of connecting a receive coil to a first circuit, determining if current within the first circuit exceeds a selected threshold, disconnecting the receive coil from the first circuit for a selected time period, and reconnecting the receive coil to the first circuit.

Further embodiments described herein may relate to, include, or take the form of a method for selectively regulating the input impedance of an inductive power receiver including at least the operations of determining a load condition of a programmable load and if the programmable load presents a low impedance, enabling an impedance regulator.

BRIEF DESCRIPTION OF THE FIGURES

Reference will now be made to representative embodiments illustrated in the accompanying figures. It should be understood that the following descriptions are not intended to limit the disclosure to one preferred embodiment. To the contrary, it is intended to cover alternatives, modifications, and equivalents as may be included within the spirit and scope of the described embodiments as defined by the appended claims.

The use of the same or similar reference numerals in different drawings indicates similar, related, or identical items.

DETAILED DESCRIPTION

Figure 1A:
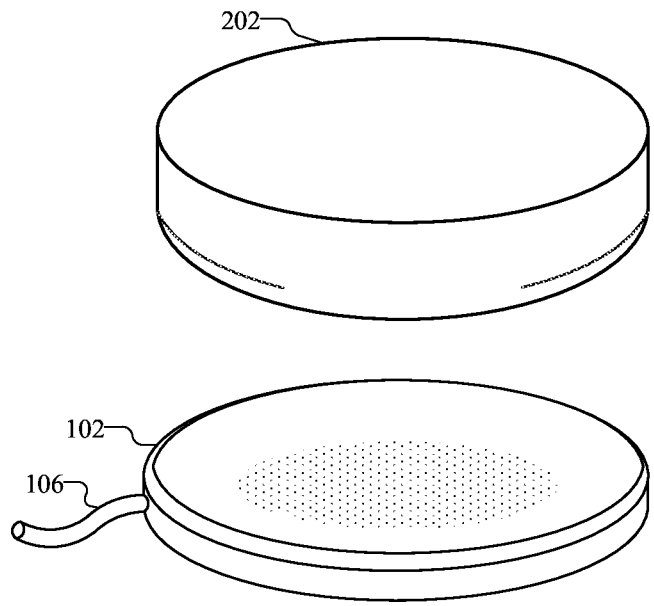
FIG. 1A depicts a front perspective view of an example inductive power transfer system in an unmated configuration.

Embodiments described herein may relate to, include, or take the form of methods and systems for automatically controlling receiver impedance within an inductive power transfer system. Further, it should be appreciated that the various embodiments described herein, as well as functionality, operation, components, and capabilities thereof may be combined with other elements as necessary, and so any physical, functional or operational discussion of any element is not intended to be limited solely to a particular embodiment to the exclusion of others.

A wireless power transfer system, such as an inductive power transfer system, typically includes an inductive power-transmitting device to transmit power and an inductive power-receiving device to receive power. In some examples, a power-receiving electronic device includes an inductive power-receiving element configured to receive wireless power and/or charge one or more internal batteries. Example power-receiving electronic devices may include media players, media storage devices, personal digital assistants, tablet computers, cellular telephones, laptop computers, smart phones, styluses, global positioning sensor units, remote control devices, wearable computing devices, electric vehicles, home appliances, location tracking devices, medical data devices, health analysis devices, health monitoring devices, timekeeping devices, sports devices, accessory devices, and so on.

In some examples, a power-transmitting device includes an inductive power-transmitting element configured to transmit wireless power to one or more power-receiving devices. Example inductive power transmitting devices may include docks, stands, clips, plugs, mats, attachments, inserts, and so on.

In many examples, the battery-powered electronic device ("accessory") may be positioned on an external surface of the power-transmitting device ("dock"). In these systems, an electromagnetic coil within the dock ("transmit coil") may produce a time-varying electromagnetic flux ("transmitting power") to induce a current within an electromagnetic coil within accessory ("receive coil"). In many examples, the transmit coil may transmit power at a selected frequency ("transmit frequency").

In one example the transmit frequency is substantially fixed, although this is not required. For example, the transmit frequency may be adjusted to improve inductive power transfer efficiency for particular operational conditions. More particularly, a high transmit frequency may be selected if more power is required by the accessory and a low transmit frequency may be selected if less power is required by the accessory.

In other examples, a transmit coil may produce a static electromagnetic field and may physically move, shift, or otherwise change its position to produce a spatially-varying electromagnetic flux to induce a current within the receive coil.

The accessory may use the received current to replenish the charge of a rechargeable battery (thereby receiving power) or to provide power to operating components associated with the accessory. In other words, when the accessory is positioned on the dock, the dock may wirelessly transmit power at a particular frequency via the transmit coil to the receive coil of the accessory.

A transmit coil and receive coil may be disposed within housings of the dock and accessory, respectively, so as to align with a mutual axis when the accessory is placed on the dock. If misaligned, the power transfer efficiency between the transmit coil and the receive coil may decrease; the amount of decrease in power transfer efficiency may vary with the amount of misalignment. Accordingly, in many examples, the wireless power transfer system may include one or more alignment assistance features to effect alignment of the transmit and receive coils along the mutual axis.

In one embodiment, the housings of the dock and accessory may assist with alignment of the transmit and receive coils. For example, a portion of the housing of the accessory may engage and/or interlock with a portion of the housing of the dock in order to affect proper alignment of the receive and transmit coils. Alignment assistance can also be provided with one or more permanent magnets. For example, a permanent magnet within the dock may attract a permanent magnet within the accessory. In further examples, multiple alignment assistance features may cooperate to affect alignment of the transmit and receive coils.

Power transfer efficiency may also decrease if the power consumption of the accessory changes (e.g., the accessory transitions from a trickle charge mode to constant current charge mode) during wireless power transfer. When the power consumption of the accessory changes, the effective impedance of the accessory may also change. This, in turn, may cause an impedance mismatch between the source (transmitter) and the load (receiver), thus reducing the power transfer efficiency between the transmit coil and receive coil. More particularly, if the accessory changes its input impedance, the leakage inductance of the receive coil may cause the voltage at the receive coil to change, which in turn may require the dock (or an electronic element controlling the dock) to change the voltage and/or current applied to the transmit coil to restore power transfer efficiency. In other examples, the dock may compensate for changes in power consumption of the accessory by changing other characteristics of the power transmitted. For example, if the power consumption of the accessory decreases, the dock may reduce the transmit frequency in response.

In some circumstances, an accessory may change its power consumption substantially faster than a dock can react or compensate. In these cases, power transfer may be inefficient during the period before the dock can compensate. In other examples, the dock and/or accessory may require additional processing power, additional data/communication channels, and/or additional control circuitry to perform and coordinate power transfer efficiency adjustments. These additional components may consume substantial power and/or may increase the complexity and cost of manufacturing of either the device or accessory. In these examples, the additional power required to operate efficiency compensation circuitry may be greater than the power lost to inefficient power transfer.

As a result, conventional wireless power transfer systems are often optimized for efficient power transfer to an accessory in a single power state, accepting inefficient power transfer for all other alternate power states of the accessory. For example, the conventional system may be optimized for efficient power transfer when the accessory is charging the battery with a constant current. When the accessory transitions to an alternate power state, for example a trickle charging state after the battery is nearly fully charged, the power transfer efficiency of the system decreases. In other words, although the accessory may receive adequate and expected power when in an alternate power state, the system on the whole may operate inefficiently.

In many examples, these conventional wireless power transfer systems waste substantial power when the accessory is in a non-optimal power consumption state. Furthermore is common in these conventional examples for an accessory to be in a non-optimal power consumption state for a substantial period of time, wasting a substantial amount of power.

For example, a user may leave the accessory on the dock to charge overnight. However, in most cases, an accessory may not require an entire night to recharge. In other words and as a non-limiting example, the accessory may be in the constant current charging mode (for which power transfer efficiency is optimized in the current example) for a relatively short period of time and, correspondingly, may be in the inefficient trickle charging mode (for which power transfer efficiency is not optimized in the current example) for the remainder of the night. In these typical examples, efficiency gains accumulated during the relatively short constant current charging mode may be rendered moot by efficiency losses sustained during use in a trickle charging mode. In this manner, although the accessory may receive adequate and expected power when trickle charging, the system on the whole may operate inefficiently for a substantial period of time.

Accordingly, many embodiments discussed herein include an automatic input impedance regulator within the accessory. The input impedance regulator may automatically regulate the input impedance of the accessory to a substantially fixed value regardless the instantaneous power requirements of the accessory. In other words, the input impedance of the accessory may be substantially independent of the various power modes of the accessory. In this manner, the input impedance of the accessory may be matched to the output impedance of the dock to provide sustained efficiency throughout various power modes of the accessory.

In one aspect, the input impedance regulator may include a direct current to direct current ("DC-to-DC") converter. More particularly, the input impedance regulator may include a boost, buck, or a buck-boost converter configured to automatically step up or step down voltage across the terminals of the receive coil. For example, in one embodiment the input impedance regulator may include a boost converter switched from the charging stage to the power stage by an asynchronous controller configured to measure current within the current loop of the charging stage.

In certain embodiments, in the charging stage, the receive coil may be electrically connected through a controllable switch (e.g., a MOSFET or the like) to one or more resistive elements having a known resistance (e.g., a resistor and the like). The asynchronous controller may measure current through this loop and may be configured to open the controllable switch when the current through the resistive elements exceeds a selected threshold.

When the controllable switch is opened and the receive coil is connected directly to the accessory, the magnetic field associated with the leakage inductance of the receive coil may begin to collapse and, correspondingly, generate a voltage ("boost voltage") to oppose the change in current resulting from disconnection of the resistive elements. The boost voltage may be added to the voltage induced within the receive coil by the transmit coil. More specifically and with respect to certain embodiments, because the receive coil is disconnected from the resistive elements while the controllable switch is open, the voltage generated by the collapsing magnetic field of the leakage inductance has the same polarity as the voltage across the terminals of the receive coil. In this manner, the boost voltage is added to the voltage provided by the receive coil to the accessory.

After a selected period of time, the asynchronous controller may close the controllable switch to reconnect the resistive elements to the receive coil, permitting the magnetic field associated with the leakage inductance of the receive coil to reform. Rapidly repeating this switching process may provide for substantially constant boosted voltage to the accessory.

Furthermore, the time required to store energy in the leakage inductance of the receive coil (e.g., generate a magnetic field) may be substantially greater than the time required to discharge the stored energy into the accessory. As a result, the input impedance regulator is typically in a charging stage (e.g., controllable switch closed, storing energy) for a substantially longer period than it is in a power stage (e.g., controllable switch closed, discharging energy). In other words, the duty cycle of the charging stage is substantially greater than that of the power stage. Thus, the time-averaged input impedance of the accessory to the transmit coil is substantially fixed, defined in major part by the resistive elements, and is largely independent of any instant changes in the power requirements of the accessory.

In other words, the boost converter may provide the accessory with the appropriate voltage needed to power the accessory given a particular accessory impedance while, at the same time and from the perspective of the transmitter, holding the input impedance of the accessory substantially constant.

In many embodiments, the asynchronous controller driving the transition between the charging stage and power stage may operate substantially faster than the transmit frequency of the transmitter. In this manner, the transmit frequency may be adjusted by the dock to optimize power transfer efficiency without causing substantial source-to-load (e.g., output to input) impedance mismatches.

In many embodiments, the input impedance regulator may be controlled at least in part by the accessory itself. For example, if the accessory determines that it should transition between a constant current charging mode to a trickle charging mode, the accessory may selectively activate or deactivate the input impedance regulator.

In certain embodiments, the amount of boost provided by the boost converter of the input impedance regulator may vary depending on the instantaneous power requirements of the accessory. The amount of boost may be controlled by the speed with which the boost converter switches between the charging stage and power stage, the resistance provided by the resistive elements, the instantaneous impedance of the accessory, or other factors.

For example, in a first power mode the accessory may have a first input impedance as seen by the input impedance regulator. To provide power to the accessory in the first power mode, a particular voltage may be required. The sum of a first boost voltage and a voltage induced within the receive coil may be sufficient to provide the particular voltage.

In a second power mode, the accessory may have a second input impedance. To provide the necessary power to the accessory in the second power mode, a second particular voltage may be required. This second particular voltage can be provided by the sum of a second boost voltage and the voltage induced within the receive coil. In this manner, the amount of boost provided by the boost converter may compensate for instantaneous power requirement changes within the accessory. At the same time, from the perspective of the dock, the input impedance of the input impedance regulator may not substantially change. In this manner, the input impedance regulator isolates the transmit coil from impedance changes of the accessory.

FIG. 1A depicts a front perspective view of an example inductive power transfer system in an unmated configuration. The illustrated embodiment shows an inductive power transmitter dock that is configured to couple to and wirelessly pass power to an inductive power receiver accessory such as a portable electronic device.

In certain embodiments the personal electronic accessory, such as is depicted in FIG. 1A, may be wearable by a user and may provide health-related information or data such as, but not limited to, heart rate data, blood pressure data, temperature data, oxygen level data, diet/nutrition information, medical reminders, health-related tips or information, or other health-related data. The personal electronic accessory may optionally convey the health-related information to a separate electronic device such as a tablet computing device, phone, personal digital assistant, computer, and so on.

A personal electronic accessory may include a coupling mechanism to connect a strap or band useful for securing to a user. For example, a smart watch may include a band or strap to secure to a user's wrist. In another example, a wearable health assistant may include a strap to connect around a user's chest, or alternately, a wearable health assistant may be adapted for use with a lanyard or necklace. In still further examples, a personal electronic device may secure to or within another part of a user's body. In these and other embodiments, the strap, band, lanyard, or other securing mechanism may include one or more electronic components or sensors in wireless or wired communication with the accessory. For example, the band secured to a smart watch may include one or more sensors, an auxiliary battery, a camera, or any other suitable electronic component.

In many examples, a personal electronic accessory, such as depicted in FIG. 1A, may include a processor coupled with or in communication with a memory, one or more communication interfaces, output devices such as displays and speakers, and one or more input devices such as buttons, dials, microphones, or touch-based interfaces. The communication interface(s) can provide electronic communications between the communications device and any external communication network, device or platform, such as but not limited to wireless interfaces, Bluetooth interfaces, Near Field Communication interfaces, infrared interfaces, USB interfaces, Wi-Fi interfaces, TCP/IP interfaces, network communications interfaces, or any conventional communication interfaces. The personal electronic device may provide information regarding time, health, statuses or externally connected or communicating devices and/or software executing on such devices, messages, video, operating commands, and so forth (and may receive any of the foregoing from an external device), in addition to communications.

Although the system 100 illustrated in FIG. 1A depicts a personal electronic accessory, any electronic device may be suitable to receive inductive power from an inductive power transmitting dock. For example, a suitable electronic device may be any portable or semi-portable electronic device that may receive inductive power, and a suitable dock device may be any portable or semi-portable docking station that may wirelessly transmit inductive power.

Accordingly, the system 100 may include an inductive power transmitter 102 and an inductive power receiver 202. The inductive power transmitter 102 and the inductive power receiver 202 may each respectively include a housing to enclose electronic components therein.

In the illustrated embodiment, the inductive power transmitter 102 may be connected to power, such as an alternating current power outlet, by power cord 106. In other embodiments, the inductive power transmitter 102 may be battery operated. In still further examples, the inductive power transmitter 102 may include a power cord 106 and an internal or external battery. Similarly, although the embodiment is depicted is shown with the power cord 106 coupled to the housing of the inductive power transmitter 102, the power cord 106 may be connected by any suitable means. For example, the power cord 106 may be removable and may include a connector that is sized to fit within an aperture or receptacle opened within the housing of the inductive power transmitter 102.

Figure 1B:
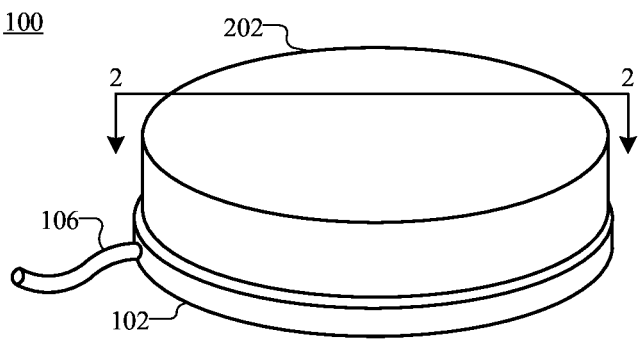
FIG. 1B depicts a front perspective view of an example inductive power transfer system in a mated configuration.

The inductive power transfer system 100 may include one or more alignment assistance features to affect alignment of the inductive power receiver 202 with the inductive power transmitter 102 along a mutual axis, for example as shown in FIG. 1B.

For example, the housings of the inductive power transmitter 102 and the inductive power receiver 202 may assist with alignment. For example, a portion of the housing of the inductive power receiver 202 may engage and/or interlock with a portion of the housing of the inductive power transmitter 102 in order to affect the desired alignment. As illustrated, a bottom portion of the inductive power receiver 202 may be substantially concave and a top surface of the inductive power transmitter 102 may be substantially convex. In other examples, the interfacing surfaces of the inductive power transmitter 102 and the inductive power receiver 202 may be substantially flat, or may include one or more additional housing features to assist with affecting mutual alignment.

Alignment assistance can also be provided with one or more permanent magnets. For example, a permanent magnet within the inductive power transmitter 102 may attract a permanent magnet within the inductive power receiver 202. In further examples, multiple alignment assistance features may cooperate to affect alignment of the transmit and receive coils.

In another example, one or more actuators in the transmitter and/or receiver devices 102 can be used to align the transmitter and receiver devices. And in yet another example, alignment assistance features, such as protrusions and corresponding indentations in the housings of the transmitter and receiver devices, may be used to align the transmitter and receiver devices. The design or configuration of the interface surfaces, one or more alignment assistance mechanisms, and one or more alignment features can be used individually or in various combinations thereof.

Although the inductive power receiver 202 is illustrated as smaller than the inductive power transmitter 102, this configuration is not required. For example in some embodiments, the inductive power transmitter 102 may be smaller than the inductive power receiver 202. In still further embodiments the two may be substantially the same size and shape. In other embodiments, the inductive power transmitter 102 and inductive power receiver 202 may take separate shapes.

Figure 2:
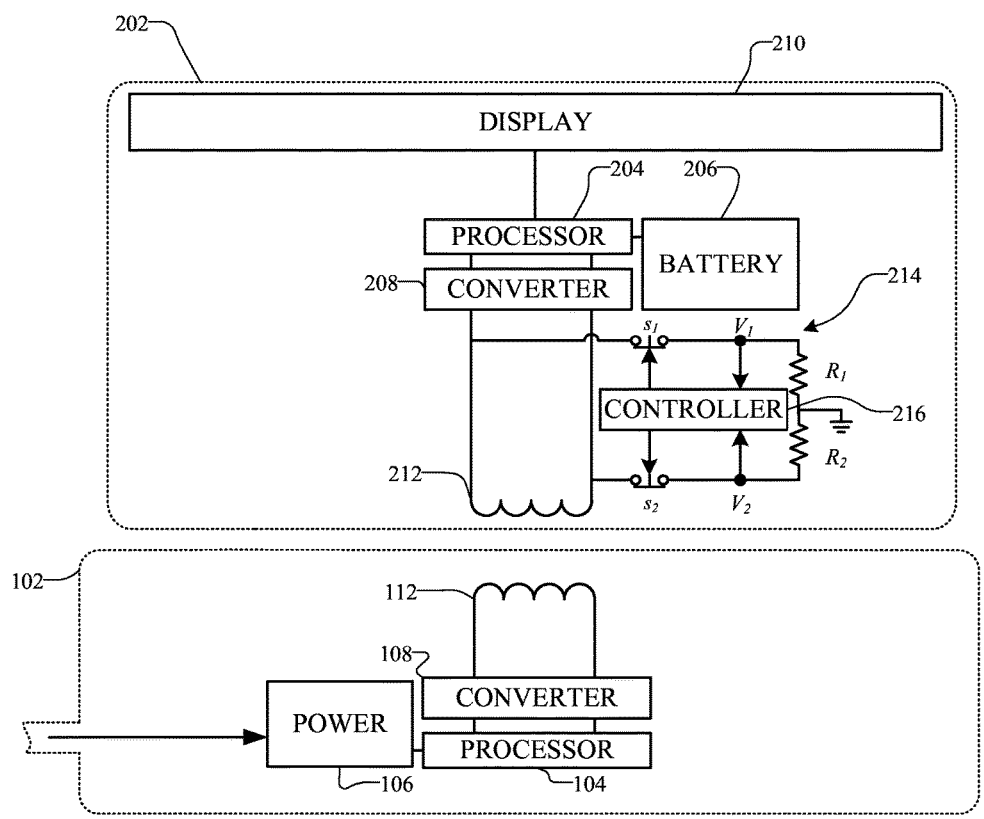
FIG. 2 depicts a side cross-section view of the inductive power transfer system of FIG. 1B along line 2-2, with an example signal flow diagram.

FIG. 2 depicts a side cross-section view of the system 100 of FIG. 1B, taken along line 2-2 of FIG. 1B, showing the example inductive power transfer system in an aligned configuration. As described partially with respect to FIG. 1A, the inductive power receiver 202 may include one or more electronic components within its housing such as a processor 204 and a receive coil 212. The receive coil 212 may have one or more windings and may receive power from the inductive power transmitter 102. Thereafter, the receive coil 212 may pass the received power through a converter 208 and thereafter to the processor 204. The converter 208 may convert alternating current to direct current. In some examples, the converter 208 may be a synchronous rectifier, bridge rectifier, half-bridge rectifier, or any other suitable converter.

After receiving rectified power from the converter 208, the processor 204 may use the received power to perform or coordinate one or more functions of the inductive power receiver 202 and/or to replenish the charge of a battery 206.

The inductive power receiver 202 may also include other electronic components coupled to the processor 204, such as a display 210. The display 210 may be any suitable display including, but not limited to, liquid crystal displays, light emitting diode displays, organic light emitting diode displays, thin film transistor displays, active matrix organic light emitting diode displays, indium gallium zinc oxide displays, and the like.

In other examples, the inductive power receiver 202 may include still further electronic components such as a memory, one or more input/output devices such as buttons, force interfaces, touch interfaces, microphones, and/or speaker(s), communication interfaces for wired and/or wireless communication, and so on.

The inductive power receiver 202 may also include one or more sensors used by the processor 204 to collect environmental information, user information, or any other type of information. Environmental sensors may include weather sensors such as barometric pressure sensors, humidity sensors, particle counters, temperature sensors, moisture sensors, ultraviolet sensors, infrared sensors, airflow and wind sensors, precipitation sensors, accumulation sensors, and so on. User information sensors may include health-related sensors such as skin conductance sensors, temperature sensors, pulse oximetry sensors, blood pressure sensors, and so on.

The inductive power transmitter 102 may also include a transmit coil 112 having one or more windings. The transmit coil 112 may transmit power to the inductive power receiver 202. The transmit coil 112 may be coupled to a processor 104 that may at least partially control the transmit coil 112. For example, in certain embodiments, the processor 104 may drive the transit coil 112 with a power signal in order to induce a particular voltage within the receive coil 212. The processor 104 may control or periodically adjust one or more aspects of the power signal applied to the transmit coil 112. For example, the processor 104 may change the operating frequency of the power signal. In some examples, the operating frequency of the power signal may be increased in order to increase the power received by the receive coil 212. In addition, the processor 104 may be used to perform or coordinate other functions of the inductive power transmitter 102.

As noted above, power transfer efficiency between the inductive power transmitter 102 and the inductive power receiver 202 may be optimized when the input impedance of the inductive power receiver 202 is substantially equal to the output impedance of the inductive power transmitter 102. In many cases, changes in the power requirements of the inductive power receiver 202 may alter the input impedance of the inductive power receiver 202. For example, if the processor 204 determines that that the inductive power receiver 202 should transition from a constant current charging of the battery 206 to a trickle charging of the battery 206, the input impedance can change. In another example, when a user adjusts the brightness of the display 210, the input impedance can change. In still further examples, when the processor 204 enables and queries the one or more sensors, the input impedance can change.

Accordingly, the inductive power receiver 202 may include an input impedance regulator 214. The input impedance regulator 214 may automatically regulate the input impedance of the inductive power receiver 202 such that regardless the instantaneous power requirements of the inductive power receiver 202, the input impedance of the receiver remains substantially the same. In many examples, the input impedance may be regulated to a value that is substantially equal to the output impedance of the inductive power transmitter 102. In this manner, the power transfer efficiency between the transmitter and receiver may not be substantially dependent on the immediate power requirements of the inductive power receiver 202.

In many examples, the input impedance regulator 214 includes a DC-to-DC converter such as a buck converter, a boost converter, or a buck-boost converter. In many embodiments, the DC-to-DC converter can exploit the leakage inductance of the receive coil 212 to provide regulated input impedance to the inductive power transmitter 102.

More particularly, the input impedance regulator 214 in one example may include a boost converter. Typically, a boost converter may apply voltage from a voltage source to an inductor. When the voltage is first applied to the inductor, current in the inductor may begin to rise and an opposing voltage may be produced across the terminals of the inductor. In this manner, until the inductor is fully charged, voltage across the inductor may decrease to zero ("charging stage"). If a resistive load is switched into the current path including the inductor, the voltage across the inductor may drop as a result of the sudden decrease in current due to the resistive load. The inductor may resist this drop in current by producing an opposing voltage which is added to the voltage of the voltage source to effectively boost the voltage across the resistive load ("power stage"). Removing the resistive load from the inductor's current loop may cause the inductor to once again accumulate charge. Repeatedly switching the resistive load into the circuit may provide a substantially constant boosted voltage across the resistive load.

In some examples, the input impedance regulator 214 may include an optional filter capacitor (not shown) parallel to the resistive load to filter certain high frequency components of a voltage change resulting from the sudden switching. In other words, the filter capacitor may smooth the voltage to the resistive load.

As may be appreciated, a time required to charge the inductor might be longer than the time required to discharge the voltage stored by the inductor into the resistive load. In other words, the duty cycle of the charging stage of the boost converter may be substantially longer in comparison to the duty cycle of the power stage of the boost converter. In this manner, the circuit may more commonly define the input impedance of the boost converter in the charging stage than it does in the power stage.

Put another way, the input impedance of the input impedance regulator 214 may vary between the power stage and charging stage, but, because the charging stage has a greater duty cycle than the power stage, the input impedance of the charging stage more substantially effects the time-averaged input impedance of the input impedance regulator 214.

Accordingly, embodiments disclosed herein include configurations in which the input impedance of the charging stage is selected or set to be substantially equal to the output impedance of the inductive power transmitter 102. In this manner, regardless of variations in the resistive load, the input impedance of the inductive power receiver 202 may be substantially equal (when time-averaged across a given time) to the output impedance of the inductive power transmitter 202.

In some embodiments, the boost converter may not require a physical inductor to charge or discharge but instead may utilize the leakage inductance (not shown) of the receive coil 212. In these embodiments, the receive coil 212 may function as the voltage source referenced above.

In further embodiments, the input impedance regulator 214 may include a controller 216 that is configured to selectively activate and deactivate (e.g., switch between) the one or more current paths coupled to the receive coil 212. For example, the controller 216 may switch between the power stage of the leakage inductance of the receive coil 212 and the charging stage of the leakage inductance of the receive coil 212. The controller 216 may switch between the power stage and the charging stage by selectively activating or deactivating one or more controllable switches $S_1$ and $S_2$. When the controller 216 determines that the input impedance regulator 214 should switch from the charging stage to the power stage, the controller 216 may open the controllable switches $S_1$ and $S_2$. Correspondingly, when the controller 216 determines that the input impedance regulator should switch from the power stage back to the charging stage, the controller 216 may close the controllable switches $S_1$ and $S_2$.

In many embodiments, the charging stage may include one or more resistive elements $R_1$ and $R_2$. As described above, the resistive elements $R_1$ and $R_2$ may substantially define the time-averaged input impedance of the inductive power receiver 202. For example, the resistive elements $R_1$ and $R_2$ may be arranged as a voltage divider, or, in the alternative, in parallel with the receive coil 212. In other embodiments the resistive elements $R_1$ and $R_2$ may be arranged in series. In still further embodiments, more or fewer resistive elements may be included.

In some embodiments, the controller 216 may switch between the power stage and charging stage at a fixed frequency. In other examples, the controller 216 may switch at a variable frequency. In these examples, the processor 204 may control or influence the frequency at which the controller 216 operates. The processor 204 may change the operating frequency of the controller 216 in response to changes in the power requirements of the inductive power receiver 202. For example, if the power requirements of the inductive power receiver 202 decrease, the controller 216 may increase its operating frequency.

In further embodiments, the controller 216 may switch between the power stage and charging stage in response to a measured voltage or current through the resistive elements $R_1$ and $R_2$. For example, the controller 216 may use voltages $V_1$, $V_2$ to calculate the current within the charging stage. When the current exceeds a selected threshold, the controller 216 may switch to the power stage. In these embodiments, the controller 216 may switch back to the charging stage after a selected time period has passed. For example, the controller 216 may determine, based on the leakage inductance of the receive coil 212, how much time is required for the leakage inductance to discharge given the impedance (e.g., instant power requirements) of the inductive power receiver 202. After the time period has lapsed, the controller 216 can close the controllable switches $S_1$ and $S_2$ to enter the charging stage. In this manner, the controller 216 may operate as a voltage or current controlled asynchronous controller.

Figure 3A:
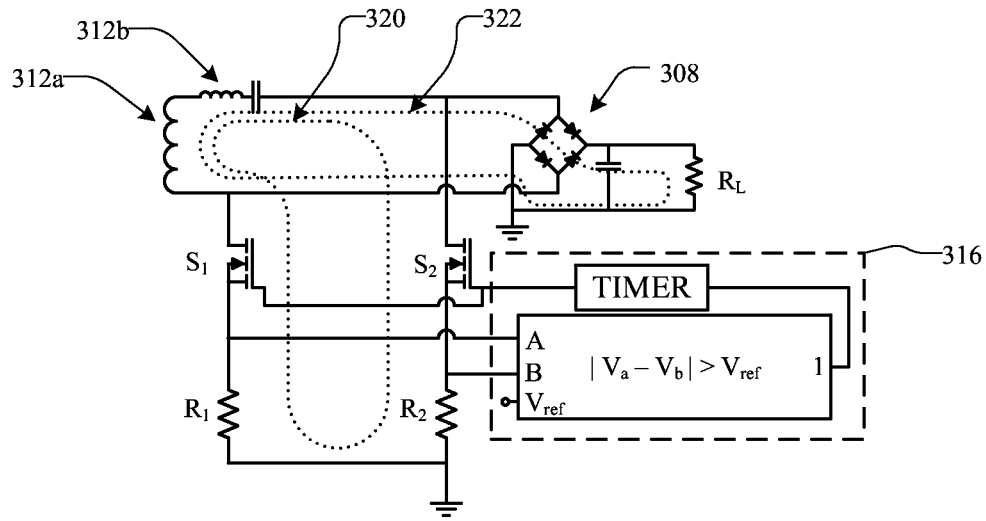
FIG. 3A depicts a simplified schematic diagram of a sample inductive power receiver having an automatic boost control operating in a charging stage.

FIG. 3A depicts a simplified schematic diagram of a sample inductive power receiver 302 with an automatic boost control in a charging stage. The receiver 302 may include a receive coil 312a. As described with respect to embodiments depicted in FIG. 2, the receive coil 312a may receive power from a transmit coil (not shown) associated with an inductive power transmitter. Because the power transfer from the transmit coil to the receive coil 312a is imperfect, the receiver 302 may include a leakage inductance, shown as inductor 312b, in series with the receive coil 312a. Thus, it should be understood that inductor 312b is not a physical circuit element but instead represents the leakage inductance. Voltage exiting leakage inductance 312b may be directed to two current paths 320, 322. The current path first may include a terminal-symmetric pair of resistive elements $R_1$, $R_2$ coupled in series with two controllable switches, illustrated here as MOSFETs $S_1$, $S_2$. The terminal-symmetric layout may be helpful to reduce ground noise in the receiver 302 during the oscillation of the voltage output from the terminals of the receive coil 312a.

As illustrated, enhancement mode n-channel MOSFETs may be used, although this configuration is not required for the controllable switches $S_1$, $S_2$. In this manner, when the gates of the controllable switches $S_1$, $S_2$ are high, current may circulate through the resistive elements $R_1$, $R_2$, to the circuit ground.

Current may also circulate within the second current path 322, although this is not required. As illustrated, the second current path 322 directs current from the receive coil 312a and leakage inductance 312 through one or more filters (which may be capacitors or other filtering elements), through a rectifying bridge 308 and into the resistive load $R_L$. The resistive load may represent the input impedance of operational circuitry of an accessory, such as the inductive power receiver 202 illustrated in FIG. 1A-1B. However, although current may flow into the resistive load through the second path 322, the resistance of the resistive elements $R_1$, $R_2$, may determine the path through which a majority of the current may flow. In many examples, the resistive elements $R_1$, $R_2$ are selected with resistances substantially lower than those expected for the resistive load. In this manner, the current flowing within the first current path 320 may be substantially larger than the current that flows within the second current path 322.

Figure 3B:
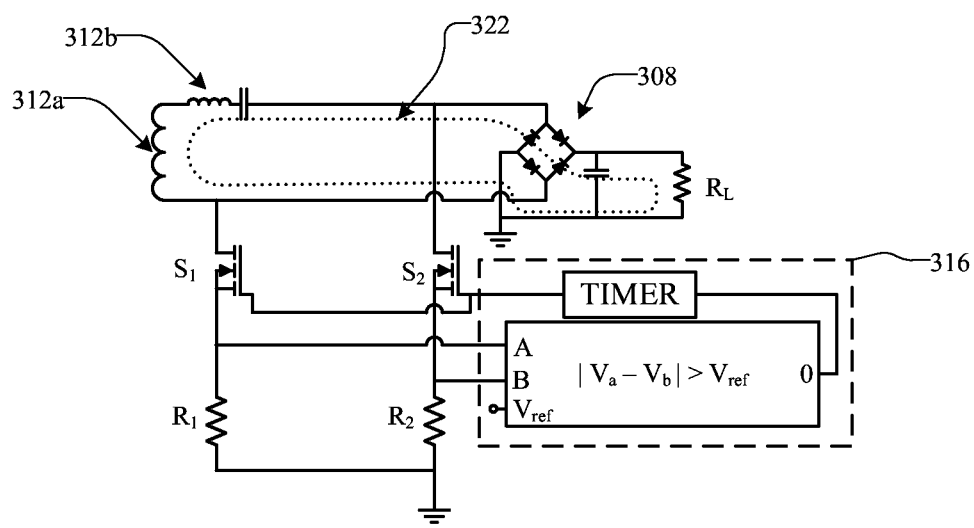
FIG. 3B depicts the simplified schematic diagram of a sample inductive power receiver of FIG. 3A with the automatic boost control operating in a power stage.

Embodiments may also include a controller 314. The controller 314 may measure current within the current path 320 in any number of suitable ways. For example as illustrated, the controller 314 may measure the voltage difference between the resistive elements at points A and B respectively. If this voltage exceeds a reference voltage, the controller 316 may trigger a one-shot timer. The one shot timer may briefly bring the gate voltage of the MOSFETs low. In this manner, the current path 320 may be disabled, and current may flow exclusively through the current path 322 as depicted in FIG. 3B.

After the one-shot timer fires, the controller 316 may restore the current path 320. Rapid switching by the controller 316 may operate as a boost converter with the leakage inductance 312b to provide regulated input impedance as substantially described above.

Figure 4:
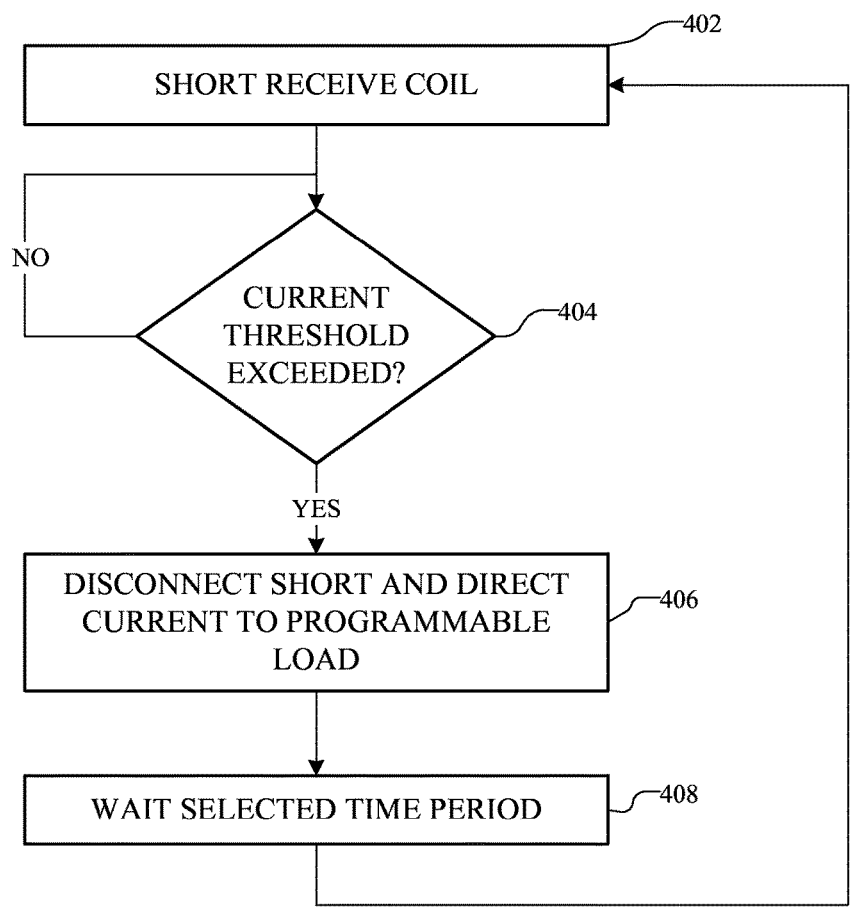
FIG. 4 is a flow diagram depicting an example method for providing automatic boost control for an inductive power transfer system.

FIG. 4 depicts a flow diagram of example operations of a method of providing automatic boost control for an inductive power receiver. The method may begin by shorting the receive coil associated with the inductive power receiver at operation 402. In many examples, shorting the receive coil may include directly connecting the terminals of the receive coil to one another to provide a short circuit. In other examples, the receive coil may not be directly shorted. For example, one or more resistors may connect the terminals of the receive coil such the circuit may not be directly short-circuited.

The method may continue at operation 404 in which the current within the short-circuited receive coil is measured. If the current within the receive coil does not exceed the threshold, the receive coil may remain shorted. If the current within the receive coil exceeds a selected threshold, the method may continue to operation 406 in which the short circuit (or resistor) is removed from the circuit and electrical current is directed to a resistive load. After a short delay at operation 408, the method may repeat by shorting the receive coil back at operation 402.

In other embodiments, as mention above, the receive coil may not be shorted at 402, but instead may be connected to one or more resistive elements. In these embodiments, the operation at 404 may measure current through one or more of the resistive elements.

Figure 5:
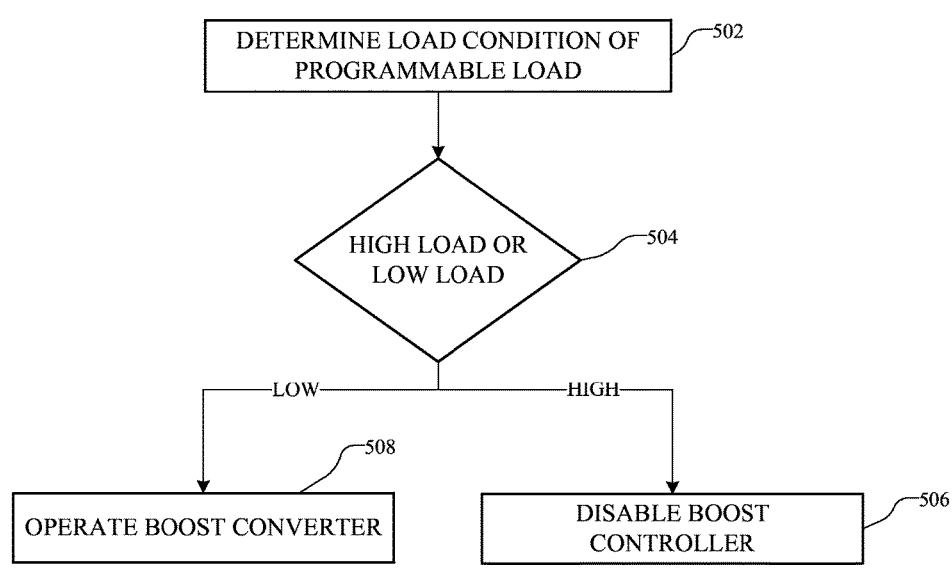
FIG. 5 depicts a flow diagram depicting an example method for providing automatic boost control for an inductive power transfer system.

FIG. 5 depicts a flow diagram of example operations of a method of providing automatic boost control for an inductive power transfer system. The method may begin with operation 502 in which the load condition of a programmable load is determined. For example, the method may include determining whether the programmable load is exhibiting a high impedance load condition or a low impedance low condition at operation 504. Thereafter, if the load condition is determined to be low, the method may proceed to operation 508, a boost converter may be enabled at operation 508. Alternatively, the boost converter may be disabled at operate 506 if the load condition is determined to be high.

In other words, the method illustrated in FIG. 5 may be a method of selectively enabling or disabling a boost converter within an inductive power receiver. In these embodiments, the boost converter may be enabled only for low load conditions, being disabled for high load conditions.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

I claim:

1. A coupled coil system for wireless power transfer between a transmitter and receiver, comprising:
   a receive coil operatively associated with the receiver;
   a transmit coil operatively associated with the transmitter and having an output impedance, further operative to wireless transmit power to the receiver;
   a rectifier connected to the transmit coil; and
   an input impedance regulator between the receive coil and the rectifier and comprising a boost converter adapted to boost an output voltage of the receive coil by charging and discharging a leakage inductance of the receive coil; wherein
   the input impedance regulator is adapted to provide an input impedance for the receiver that is substantially equal to the output impedance of the transmit coil.

2. The coupled coil system of claim 1, wherein the input impedance regulator comprises a direct current to direct current converter selected from the group consisting of boost converters, buck converters, and boost-buck converters.

3. The coupled coil system of claim 2, wherein:
   the transmitter is contained within a first housing; and
   the receiver is contained within a second housing.

4. The coupled coil system of claim 3, wherein:
   the first housing comprises an interface surface; and
   the second housing comprises a contact surface.

5. The coupled coil system of claim 1, wherein the boost converter comprises at least a charging stage and a power stage.

6. The coupled coil system of claim 5, wherein:
   the charging stage comprises at least a first current path including at least one resistive element; and
   the power stage comprises a second current path including a resistive load within the receiver.

7. The coupled coil system of claim 6, wherein the impedance regulator is configured to switch from the charging stage and power stage in response to a determination that current through the at least one resistive element exceeds a selected threshold.

8. The coupled coil system of claim 7, wherein the impedance regulator is configured to switch from the power stage to the charging stage after a selected time period.

9. The coupled coil system of claim 8, wherein the impedance regulator is configured to switch from the charging stage and power stage in response to a determination that the impedance of the receiver has changed.

10. The coupled coil system of claim 6, wherein the at least one resistive element is a variable resistor.

11. An inductive charging system comprising:
    an electronic device comprising:
       a rechargeable battery;
       a rectifier circuit connected to the battery;
       a receive coil electrically associated with the battery; and
       an impedance regulator electrically connected to the receive coil, between the receive coil and the rectifier circuit, the impedance regulator comprising:
          a first resistive element in series with a first controllable switch coupling a first lead of the receive coil to ground; and
          a second resistive element in series with a second controllable switch coupling a second lead of the receive coil to ground; wherein
    the impedance regulator is configured to close the first controllable switch and the second controllable switch in response to a change in voltage difference between a first voltage across the first resistive element and a second voltage across the second resistive element.

12. The inductive charging system of claim 11, further comprising:
    an inductive charging device comprising:
       a housing comprising an interface surface for receiving the electronic device; and
       a transmit coil within the housing and positioned below the interface surface.

13. The inductive charging system of claim 12, wherein the impedance regulator is adapted to adjust the input impedance of the receiver to be substantially equal to the output impedance of the transmitter.

14. The inductive charging system of claim 13, wherein the impedance regulator comprises a direct current to direct current converter selected from the group consisting of boost converters, buck converters, and boost-buck converters.

15. An inductive power transfer system comprising:
    a receiver comprising a receive coil configured to receive power from a transmit coil; and
    an impedance regulator electrically coupled between the receive coil and a rectifier, the impedance regulator comprising a boost converter adapted to operate with a leakage inductance associated with the receive coil, the impedance regulator adapted to provide an input impedance of the receiver.

16. The inductive power transfer system of claim 15, wherein the impedance regulator is configured to adjust the input impedance of the receiver to match an output impedance of the transmit coil.

17. The inductive power transfer system of claim 15, wherein the impedance regulator comprises a boost-buck converter.

18. The inductive power transfer system of claim 17, wherein the boost converter is coupled to a rechargeable battery.

\* \* \* \* \*